United States Patent [19]

Okada

[11] Patent Number: 5,294,824

[45] Date of Patent: Mar. 15, 1994

[54] HIGH VOLTAGE TRANSISTOR HAVING REDUCED ON-RESISTANCE

[75] Inventor: David N. Okada, Tempe, Ariz.

[73] Assignee: Motorola, Inc., Schaumburg, Ill.

[21] Appl. No.: 922,718

[22] Filed: Jul. 31, 1992

[51] Int. Cl.$^5$ .................. H01L 29/82; H01L 29/76; H01L 29/94; H01L 31/062

[52] U.S. Cl. .................. 257/409; 257/327; 257/339; 257/342; 257/343

[58] Field of Search ............ 257/339, 342, 343, 409, 257/327

[56] References Cited

U.S. PATENT DOCUMENTS 4,300,150 11/1981 Colak ........................... 257/339
4,626,879 12/1986 Colak ........................... 257/339
4,811,075 3/1989 Eklund .......................... 257/408
5,023,678 6/1991 Kinzer .......................... 257/409

Primary Examiner—Rolf Hille
Assistant Examiner—Steven Loke
Attorney, Agent, or Firm—Gary W. Hoshizaki; Joe E. Barbee

[57] ABSTRACT

A method for forming a plurality of surface conduction paths (33) in a conductive region (16) of a first conductivity type. A plurality of areas (17) of a second conductivity type are formed in the conductive region (16). The plurality of areas (17) deplete the conductive region (16) when a reverse bias voltage is placed across the conductive region (16) and the plurality of areas (17). Area of the conductive region (16) adjacent to each of the plurality of areas (17) form the plurality of surface conduction paths (33) for conducting current through the conductive region (16).

15 Claims, 1 Drawing Sheet

HIGH VOLTAGE TRANSISTOR HAVING REDUCED ON-RESISTANCE

BACKGROUND OF THE INVENTION

This invention relates, in general, to semiconductor devices, and more particularly to lateral high voltage transistors.

Typical semiconductor transistor design starts with a group of performance specifications which generally cannot be met by a current device design or a process flow. The difficulty with designing semiconductor devices which can handle higher voltages or deliver higher current to a load is that changes to a process or a device design which increase performance in one area will almost always reduce performance in another.

For example, design changes to make a device withstand higher voltages usually involve changing process dopings to increase junction breakdown voltages and to increase device spacings. These types of changes increase device size and increase device on-resistance which are contradictory to the results to be achieved.

A lateral high voltage transistor is one type of device which has gone through an evolutionary process to increase breakdown voltage (when the device is off) yet reduce channel resistance when enabled. Initially, lateral high voltage transistors were designed similarly to standard MOSFET transistors. Process dopings and spacings were chosen to withstand specific voltage breakdowns. Channel resistance was reduced by making the channel width extremely large. Current from the device traveled from drain to source mainly along the semiconductor channel surface. Alternate approaches have been developed which greatly enhance transistor performance in a multitude of areas.

A reduced surface field device as described in U.S. Pat. No. 4,811,075 is a lateral high voltage transistor which decreases channel resistance and increases voltage breakdown of a device when compared to a standard MOSFET transistor of similar size and breakdown voltage. Two main components of the reduced surface field device are 1) an extended drain region and 2) a surface layer in the extended drain region. The extended drain region is formed in a region of opposite doping type such as a substrate. The extended drain region is a portion of a conductive path from drain to source of the device so its resistance is critical to device performance. The length and doping of the extended drain region is a factor in transistor breakdown voltage. The extended drain region becomes increasingly depleted as the voltage across the transistor is increased. The transistor is designed to have a fully depleted extended drain region at approximately the device breakdown voltage. Critical in having high breakdown voltage with minimal degradation of on-state resistance is the fact that applied voltage is dropped linearly across the length of the depletion region formed in the extended drain region.

The surface layer formed in the extended drain region has an opposite doping type. The surface layer forms a diode with the extended drain region. The substrate in which the extended drain region is formed and the surface layer both form reverse biased diodes with the extended drain region. Each diode increasingly depletes the extended drain region as voltage is increased across the transistor. The diode formed by the surface layer allows a higher doping level to be used in the extended drain region since the extended drain region is being depleted from the top and bottom. The higher doping level reduces resistance of the extended drain region without drastically affecting device breakdown voltage. The surface layer changes current flow in the extended drain region from the surface to an area of the extended drain region below the surface layer.

It would be of great benefit if a structure could be developed which reduces device size, decreases channel resistance, and has a high breakdown voltage thereby increasing performance and reducing manufacturing costs of a high voltage transistor.

SUMMARY OF THE INVENTION

Briefly stated, this invention comprises a transistor and method for forming the same includes a plurality of surface conduction paths in a conductive region. A conductive region is formed of a first conductivity type. A plurality of areas of a second conductivity type are formed in the conductive region for depleting the conductive region when a reverse bias voltage is placed across the conductive region and the plurality areas. Area of the conductive region adjacent to each of the plurality of areas form the plurality of conduction paths for conducting current through the conductive region.

DETAILED DESCRIPTION OF THE DRAWINGS

Figure 1:
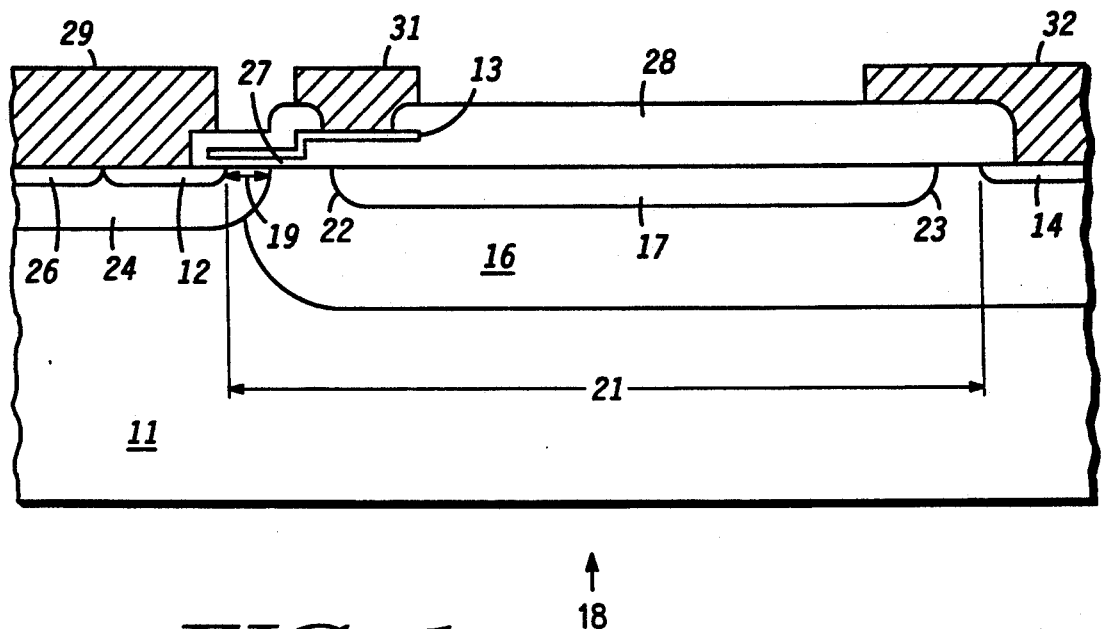
FIG. 1 is a cross-sectional view of a lateral high voltage transistor in accordance with the present invention.

FIG. 1 is a cross-sectional view of a lateral high voltage transistor in accordance with the present invention.

Illustrated in FIG. 1 is a n-channel lateral high voltage transistor 18. N-channel lateral high voltage transistor 18 is used for illustration purposes only and is not meant to imply that this invention relates to only n-channel transistors.

A p-type semiconductor substrate 11 is used to form n-channel lateral high voltage transistor 18. A n-type extended drain region 16 is formed in substrate 11. N-type extended drain region 16 comprises an epitaxial layer or an n-well typically formed by implantation or diffusion. Extended drain region 16 is a conductive region for conducting current through n-channel lateral high voltage transistor 18 and increasing breakdown voltage. The width, length, depth and doping concentration of extended drain region 16 plays a role in determining n-channel lateral high voltage transistor 18 on-state resistance and breakdown voltage.

In the preferred embodiment, a p-type tub or region 24 is formed in substrate 11. Wafer process steps for driving in p-type tub 24 also cause p-type tub 24 to out diffuse into extended drain region 16. A n-type source region 12 is formed a predetermined distance from extended drain region 16 in p-type tub 24. A channel length of n-channel lateral high voltage transistor 18 is measured between source region 12 and extended drain region 16 in an area formed by p-type tub 24 (the out diffused area). The channel length is indicated by double headed arrow 19 and is analogous to a channel length (L) of a standard MOSFET device. A p-type area or region 26 is formed in p-type tub 24 to provide a low resistance contact to p-type tub 24. In the preferred embodiment, p-type tub 24, p-type area 26, and source 12 are coupled together.

A n-type drain region 14 is formed in extended drain region 16 a predetermined distance from source 12. The predetermined distance is indicated by double headed arrow 21. Channel resistance of n-channel lateral high voltage transistor 18 is dominated by the resistance of extended drain region 16 between drain region 14 and source region 12. Modifying design characteristics of n-channel lateral high voltage transistor 18 to provide low on-state resistance or high breakdown voltage are difficult to achieve simultaneously. High voltage breakdown necessitates a long, lightly doped, extended drain region which increases on-state resistance.

Prior art methods for increasing doping in an extended drain region focus on a surface layer formed in the extended drain region which allows a higher doping concentration in the extended drain region to be used. Two reversed biased diode junctions are formed in conjunction with the extended drain region. A first diode is a substrate and extended drain region diode. The second diode is the surface layer and extended drain region. The premise of prior art is that as the drain voltage is increased both the first and second diode junctions becomes increasingly reverse biased. The reverse biased diode junctions increasingly depletes the extended drain region from both the top and the bottom. The extended drain region is designed to be fully depleted at approximately the device breakdown voltage. Since the extended drain is depleted from the top and bottom a doping concentration twice as high can be used in the extended drain region without affecting transistor breakdown voltage. The higher doping concentration in the extended drain region due to the surface layer allows a smaller device to achieve a given on-state resistance or a device of equal size with lower on-state resistance to be formed.

Formation of the surface layer as taught by prior art has at least two drawbacks. First, the surface layer occupies space in the extended drain region which reduces conduction area of the device. A smaller conduction area increases on-state resistance but the heavier doped extended drain region more than compensates for the loss in conduction area providing a net benefit which lowers on-state resistance. Second, the surface layer spacing can increase channel resistance if placed to close to the edge of drift region near the transistor source by reducing transistor conduction area near that point. Moving the surface layer away from the edge of the drift region near the transistor source can also be a problem. The surface layer can be moved so that it is not effective in fully depleting the source edge of the extended drain region thus degrading the breakdown voltage of the transistor. Choosing an appropriate spacing for the surface layer results in a compromise between breakdown voltage and conduction area in the transistor.

Low resistance lateral high voltage transistor 18 solves these problems and takes the concept of a surface layer one step further which provides several advantages. Thus, a plurality of p-type areas or regions 17 are formed in a extended drain region 16 with respect to one another. Typically, when forming extended drain region 16 in substrate 11 the doping concentrations are highest near the surface and become lower farther from the surface. To keep transistor on-state resistance to a minimum it is beneficial for current to travel through conduction areas of highest doping concentrations (near the surface of extended drain region 16). Opening areas for conduction near the surface of extended drain region 16 is accomplished by the plurality of p-type areas 17. In the preferred embodiment, p-type areas 17 are a plurality of parallel rectangular areas. The plurality of parallel rectangular areas are between source region 12 and drain region 14 in extended drain region 16. Each p-type area 17 has a first side 22 facing source 12 and a second side 23 facing drain region 14. Unlike prior art which have a single p-type surface layer covering a surface of a extended drain region, the plurality of p-type areas 17 of the present embodiment forms a plurality of surface conduction paths in extended drain region 16. A surface conduction path is formed between adjacent p-type areas 17 or at a periphery of extended drain region 16. The surface conduction paths maximize conduction area within extended drain region 16 lowering channel resistance of n-channel lateral high voltage transistor 18. Conceptually, plurality of p-type areas 17 serve the same function as a single p-type surface layer in allowing a higher doping to be used in extended drain region 16 (thereby decreasing channel resistance) without affecting breakdown voltage significantly. Voltage bias on plurality of p-type areas 17 is achieved by a depletion region formed by p-type tub 24 (which is coupled to source 12) and extended drain region 16. Plurality of p-type areas 17 are placed in extended drain region 16 such that the depletion region extends out and couples to plurality of p-type areas 17 biasing them at a voltage similar to a voltage placed on p-type tub 24. Plurality of p-type areas 17 form a plurality of diodes with extended drain region 16. As the voltage on drain 14 is increased both a diode formed by substrate 11 and extended drain region 16 and the plurality of diodes become increasingly reverse biased. Each p-type area 17 not only forms a depletion region vertically into extended drain region 16 but also a depletion region laterally along the surface of extended drain region 16. Area between plurality of p-type areas 17 is completely depleted under high voltage conditions thereby acting similarly to a p-type surface layer. The dimensions and spacings of plurality of p-type areas 17 is chosen in conjunction with a transistor breakdown voltage (in an off-state) such that extended drain region 16 is fully depleted by semiconductor substrate 11 and plurality of p-type areas 17 at a voltage similar to the transistor breakdown voltage.

The benefits of forming n-channel lateral high voltage transistor 18 having a plurality of p-type areas is significant. Calculations indicate that forming the plurality of surface conduction paths provides a reduction in channel resistance of approximately 30 percent when compared with a transistor formed with a p-type surface layer. An equivalent device can be formed using plurality of p-type areas 17 that is 30 percent smaller in area than that of an equivalent transistor formed using prior art techniques thereby reducing transistor chip size while increasing yields and reducing cost. Plurality of p-type areas 17 can also be used to form a transistor having a lower channel resistance for a given area. All this is accomplished without any significant reduction in transistor breakdown voltage.

The description of n-channel lateral high voltage transistor 18 has not been completed. Additional wafer processing steps are needed to form the transistor.

A layer of insulating material 27 is placed on substrate 11 between source 12 and extended drain region 16.

Insulating material 27 also overlaps a portion of source 12 and extended drain region 16. In the preferred embodiment, the layer of insulating material 27 is silicon dioxide. A layer of conductive material 13 is formed on layer of insulating material 27 forming a gate to n-channel lateral high voltage transistor 18. In the preferred embodiment, conductive material 13 is doped polysilicon. Generally, the polysilicon can be doped of either n or p conductivity type. In the preferred embodiment, n-type doping is used to dope polysilicon which forms a gate for a n-channel or a p-channel transistor. Conductive material 13 is formed to provide a contact area for connection purposes.

Silicon dioxide is deposited on exposed areas of n-channel lateral high voltage transistor 18 forming an insulating layer 28 using conventional processing steps. Oxide is removed from an area covering conductive material 13 exposing the gate. A metal contact 31 connects to conductive material 13 for coupling the gate to other elements. A metal contact 32 connects to drain 14 for coupling to other elements. In the preferred embodiment, a metal contact 29 connects to p-type area 26 and source region 12. P-type tub 24 is thus coupled to source 12. Metal contact 29 is used to couple source region 12 to other elements.

A positive voltage bias applied from the gate to source region 12 forms a n-type inversion layer coupling source 12 to extended drain region 16. N-channel lateral high voltage transistor 18 is designed to have a small voltage drop from drain region 14 to source region 12 when the device is enabled. This is due to the low channel resistance of enabled transistor 18 when compared to a load resistance to which transistor 18 is coupled. When transistor 18 is enabled the plurality of diodes and the diode formed by substrate 11 and extended drain region 16 are not strongly reverse biased thereby forming small depletion regions within extended drain region 16. The area of extended drain region 16 not having plurality of p-type areas 17 (plurality of surface conduction paths and subsurface area of extended drain region 16) can conduct current from drain 14 to source 12.

Figure 2:
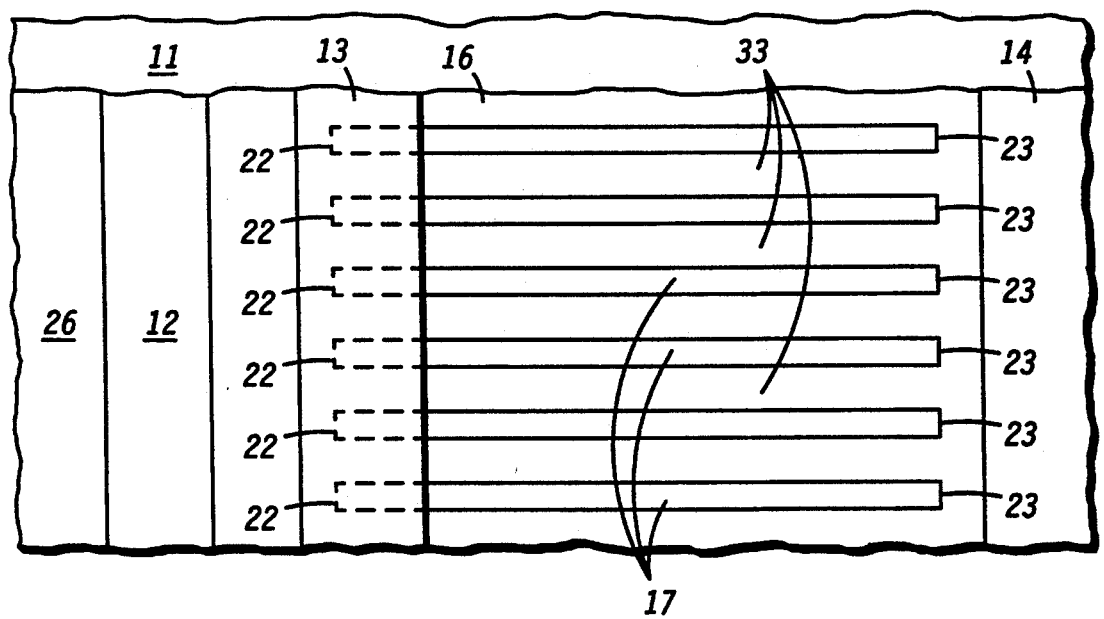
FIG. 2 is an illustration showing a plurality of rectangular areas formed in a extended drain region in accordance with the present invention.

FIG. 2 is an illustration of a plurality of rectangular areas formed in a extended drain region in accordance with the present invention.

A top view of n-channel lateral high voltage transistor 18 best illustrates a plurality of surface conduction paths 33 formed by plurality of p-type areas 17. Plurality of p-type areas 17 are shown as the plurality of parallel rectangular areas described in FIG. 1. Side 22 of each parallel rectangular area faces source 12 and side 23 of each parallel rectangular area faces drain 14 thus aligning plurality of surface conduction path to the direction of current flow through extended drain region 16. Conductive material 13 forms the gate for coupling extended drain region 16 to source 12.

The plurality of p-type areas 17 are not connected directly to a voltage source. Plurality of p-type areas 17 is indirectly coupled to a voltage substantially similar to a voltage coupled to source region 12. In the preferred embodiment, p-type tub 24 (FIG. 1) is coupled to source 12. P-type tub 24 forms a diode with extended drain region 16. A depletion region is formed in both p-type tub 24 and extended drain region 16. Side 22 of each p-type area 17 is spaced a predetermined distance from p-tub 24. The predetermined distance is chosen such that the depletion region formed in extended drain region 16 by p-type tub 24 and extended drain region 16 extends out to each p-type area 17. The depletion region couples each p-type area to a voltage substantially similar to the voltage at source 12.

The top view of n-channel lateral high voltage transistor 18 shows the surface conduction paths 33. It is noted that surface conduction paths 33 provide the shortest current flow path from source region 12 to drain region 14 in an area of heaviest doping and increase overall conduction area for carrying current through extended drain 16. Also, spacing between side 22 of each p-type area 17 and p-type tub 24 is not a critical parameter in the channel resistance of n-channel lateral high voltage transistor 18 because current conduction through extended drain 16 does not get pinched off by p-type areas 17 due to surface conduction paths 33.

Each p-type area 17 has a width as small as wafer process photolithographic techniques allow thereby maximizing surface conduction path area through extended drain region 16. Spacing between adjacent p-type areas 17 is based on doping levels of p-type areas 17 and extended drain region 16. Spacing is chosen to fully deplete area between adjacent p-type areas 17 at approximately the device breakdown voltage. The number of p-type areas 17 placed in extended drain region 16 is the minimum number needed to fully deplete extended drain region 16. Doping of p-type areas 17 is chosen to insure each are fully depleted at approximately the device breakdown voltage.

The device described in FIGS. 1 and 2 is a n-channel transistor and was chosen only to provide a functional description of the lateral high voltage transistor. A p-channel lateral high voltage transistor can be made by simply reversing the dopant types described in FIGS. 1 and 2. For example, by changing p-type substrate 11 to a n-type substrate, changing n-type source 12 to a p-type source, changing p-type tub 24 to a n-type tub, changing n-type drain 14 to a p-type drain, changing n-type extended drain region 16 to a p-type extended drain region, and changing plurality of p-type areas 17 to a plurality of n-type areas produces a P-channel device in accordance with the present invention.

Complementary devices (both p and n-channel transistors) can also be formed on the same substrate. An n-channel lateral high voltage transistor 18 has been formed in p-type substrate 11 as illustrated in FIGS. 1 and 2. Formation of a p-channel transistor can be accomplished by simply adding a n-well in p-type substrate 11 in which a p-channel lateral high voltage transistor can then be formed. Thus, a p-type source, drain, and extended drain region are formed in the n-well. A n-type tub may be needed (analogous to p-type tub 24) between the p-type source and p-type extended drain region. A plurality of n-type areas are formed in the extended drain region. Forming gates, n-type tub contacts, oxide layers, and metalization is similar to that described in the formation of n-channel lateral high voltage transistor 18.

By now it should be appreciated that a lateral high voltage transistor has been described which lowers channel resistance for a predetermined transistor area or provides a reduction in transistor size for a predetermined breakdown voltage. A plurality of areas are formed in a channel region of a transistor for depleting an extended drain region under high voltage conditions thereby maximizing device breakdown voltage. Space between the plurality of areas form surface conduction paths for conducting current when the transistor is enabled which lowers transistor channel resistance. Transistor performance (reduced parasitic capacitances) and yields are increased while manufacturing costs decrease due to a reduced transistor size which can be realized by this invention.

I claim:

1. A high voltage transistor comprising:
a semiconductor substrate of a first conductivity type;
a source of a second conductivity type formed in the semiconductor substrate;
an extended drain region of said second conductivity type formed in the semiconductor substrate a predetermined distance from said source;
a drain of said second conductivity type formed in said extended darin region;
a plurality of areas of said first conductivity type formed in said extended drain region in a predetermined manner with respect to each other, said plurality of areas being contained in said extended drain region and separate from one another;
an insulation layer formed on said semiconductor substrate between said source and said extended drain region wherein sad insulation layer overlaps said source and said extended drain region; and
a layer of conductive material formed on said insulation layer forming a gate.

2. The high voltage transistor of claim 1 further including:
an area formed of said first conductivity type in said semiconductor substrate between said source and said extended drain region wherein said area formed of said first conductivity type is coupled to the source;
said insulation layer being silicon dioxide; and
said layer of conductive material being doped polysilicon.

3. The high voltage transistor of claim 1 wherein said plurality of areas of said first conductivity type formed in said extended drain region being parallel rectangular areas.

4. The high voltage transistor of claim 3 wherein said parallel rectangular areas are formed between said drain and said source.

5. A high voltage transistor comprising:
a semiconductor substrate of a first conductivity type;
a source of a second conductivity type formed in the semiconductor substrate;
an extended drain region of said second conductivity type formed in the semiconductor substrate a predetermined distance from said source;
a drain of said second conductivity type formed in said extended drain region;
a plurality of areas of said first conductivity type formed in said extended drain region in a predetermined manner with respect to each other, said plurality of areas being contained in said extended drain region and said plurality of areas being parallel rectangular areas formed between said drain and said source wherein said parallel rectangular areas and said semiconductor substrate fully deplete said extended drain region at a voltage substantially equal to a breakdown voltage of said high voltage transistor wherein said parallel rectangular areas are at a similar voltage as said source of said high voltage transistor;
an insulation layer formed on said semiconductor substrate between said source and said extended drain region wherein said insulation layer overlaps said source and said extended drain region; and
a layer of conductive material formed on said insulation layer forming a gate.

6. The high voltage transistor of claim 5 wherein each of said parallel rectangular areas has a first side facing said source and wherein each of said parallel rectangular areas has a second side facing said drain.

7. The high voltage transistor of claim 6 wherein a plurality of surface conduction paths conduct current in said extended drain region when said high voltage transistor is in an on-state.

8. The high voltage transistor of claim 7 wherein said plurality of surface conduction paths comprises area of said extended drain region adjacent to each of said parallel rectangular areas.

9. A transistor comprising:
a first conductive region of a first conductivity type;
a second conductive region of a second conductivity type formed in said first conductive region, said second conductive region provides a conductive path when the transistor is enabled; and
a plurality of areas of said first conductivity type formed in said second conductive region, said plurality of areas are spaced a predetermined distance from one another and area of said second conductive region between said plurality of areas form a plurality of surface conduction paths for conducting current when the transistor is enabled, said plurality of areas are separate from one another and contained within said second conductive region.

10. The transistor of claim 9 further including:
a third conductive region of said second conductivity type formed in said second conductive region, said third conductive region forms a drain region for the transistor;
a fourth conductive region of said second conductivity type formed in said first conductive region a predetermined distance from said second conductive region, said fourth conductive region forming a source region of the transistor; and
a gate for coupling said fourth conductive region to said second conductive region when a voltage bias is applied to said gate.

11. The transistor of claim 10 wherein said plurality of areas are placed between said third conductive region and said fourth conductive region.

12. The transistor of claim 11 wherein said plurality of areas are formed as a plurality of parallel rectangular areas, said plurality of parallel rectangular areas are aligned such that said plurality of conduction paths couple said source region to said drain region when the transistor is enabled.

13. A transistor comprising:
a first conductive region of a first conductivity type;
a second conductive region of a second conductivity type formed in said first conductive region, said second conductive region providing a conductive path when the transistor is enabled;
a plurality of areas of said first conductivity type formed in said second conductive region, said plurality of areas are spaced a predetermined distance from one another and area of said second conductive region between said plurality of areas form a plurality of surface conduction paths for conducting current when the transistor is enabled, said plurality of areas being contained within said second conductive region and being formed as a plurality of parallel rectangular areas having two short sides and two long sides;

a third conductive region of said second conductivity type formed in said second conductive region, said third conductive region forms a drain region for the transistor;

a fourth conductive region of said second conductivity type formed in said fist conductive region a predetermined distance from said second conductive region, said fourth conductive region forming a source region of the transistor wherein said plurality of parallel rectangular areas are placed between said third conductive region and said fourth conductive region, wherein said plurality of parallel rectangular areas are aligned such that a short side of each rectangular area faces either said third or fourth conductive region, wherein area of said second conductive region between said parallel rectangular areas form said plurality of conductive paths to said third conductive region and wherein said plurality of parallel rectangular areas are spaced a predetermined distance from one another and are surrounded by the second conductive region, said predetermined distance is chosen to deplete area between said parallel rectangular areas at a predetermined reverse bias voltage between said second conductive region and said plurality of parallel rectangular areas; and a gate for coupling said fourth conductive region to said second conductive region when a voltage bias is applied to said gate.

14. The transistor of claim 13 wherein said plurality of parallel rectangular areas is coupled to a voltage potential through a depletion region formed by said second conductive region and said first conductive region.

15. The transistor of claim 14 wherein said second conductive region being fully depleted by said plurality of parallel rectangular areas and said first conductive region to maximize breakdown voltage of the transistor.

* * * * *

UNITED STATES PATENT AND TRADEMARK OFFICE
CERTIFICATE OF CORRECTION

PATENT NO. : 5,294,824
DATED : March 15, 1994
INVENTOR(S) : David Okada

It is certified that error appears in the above-indentified patent and that said Letters Patent is hereby corrected as shown below:

In column 7, line 15, claim 1, delete "darin" and insert therefor --drain--.

In column 9, line 8, claim 13, delete "fist" and insert therefor --first--.

Signed and Sealed this

Seventh Day of February, 1995

*Attest:*

BRUCE LEHMAN

*Attesting Officer*    *Commissioner of Patents and Trademarks*